United States Patent
Shin et al.

(10) Patent No.: US 10,510,382 B2
(45) Date of Patent: Dec. 17, 2019

(54) HARDWARE AUTOMATED LINK CONTROL OF DAISY-CHAINED STORAGE DEVICE

(71) Applicant: QUALCOMM Incorporated, San Diego, CA (US)

(72) Inventors: Hyunsuk Shin, San Diego, CA (US); David Teb, Haifa (IL); Hung Vuong, Carlsbad, CA (US); Venkatakrishnan Gopalakrishnan, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 314 days.

(21) Appl. No.: 15/782,833

(22) Filed: Oct. 12, 2017

(65) Prior Publication Data
US 2018/0137896 A1 May 17, 2018

Related U.S. Application Data

(60) Provisional application No. 62/420,935, filed on Nov. 11, 2016.

(51) Int. Cl.
*G11C 7/10* (2006.01)
*G06F 13/42* (2006.01)
(Continued)

(52) U.S. Cl.
CPC .......... *G11C 7/1003* (2013.01); *G06F 3/0619* (2013.01); *G06F 12/0246* (2013.01);
(Continued)

(58) Field of Classification Search
CPC ............. G06F 11/2007; G06F 12/0246; G06F 3/0601; G06F 2003/0697; G06F 11/2017; G06F 13/4247; H04L 67/1097
(Continued)

(56) References Cited

U.S. PATENT DOCUMENTS 7,882,320 B2    2/2011 Caulkins
8,238,244 B2    8/2012 Radke et al.
(Continued)

OTHER PUBLICATIONS

Author Unknown: "Universal Flash Storage (UFS 1.1)," JEDEC Standard JESD220A, JEDEC Solid State Technology Association, Jun. 1, 2012 (Jun. 1, 2012), 408 pages, XP009186070, Retrieved from the Internet: URL:http://www.scribd.com/doc/162489689/JESD220A#scribd, [retrieved on Sep. 17, 2015].
(Continued)

*Primary Examiner* — Faisal M Zaman
(74) *Attorney, Agent, or Firm* — Holland & hart LLP-CLX

(57) ABSTRACT

In conventional systems with a plurality of UFS devices daisy-chained to a UFS host, a UFS device driver must be able to differentiate among the links, and send either link control messages or data/management (D/M) messages to a UFS host controller. This can make force the UFS device driver to be complicated and error prone. To address this issue, a host controller can provide a uniform view of a plurality of daisy-chained devices to a device driver of a host. For example, the host controller can be such that from the perspective of the device driver, each device can appear to be a point-to-point connected device. This can allow the device driver to use a same set of link control messages to control the links. In this way, the device driver can be simplified and thus less error prone.

32 Claims, 11 Drawing Sheets

(51) Int. Cl.
    *G06F 13/10*         (2006.01)
    *G06F 3/06*          (2006.01)
    *G06F 12/02*         (2006.01)
    *G06F 13/16*         (2006.01)

(52) U.S. Cl.
    CPC ........ *G06F 13/102* (2013.01); *G06F 13/1668* (2013.01); *G06F 13/4247* (2013.01)

(58) Field of Classification Search
    USPC ......... 714/E11.092, 103, 100; 710/100, 305, 710/74, 110, 2
    See application file for complete search history.

(56) References Cited

U.S. PATENT DOCUMENTS

| | | | |
|---|---|---|---|
| 8,543,802 B2 | 9/2013 | Radke et al. | |
| 8,856,501 B2 | 10/2014 | Hakoun et al. | |
| 9,240,227 B2 | 1/2016 | Pyeon et al. | |
| 2011/0320640 A1* | 12/2011 | Butler | H04L 41/12 710/8 |
| 2016/0005488 A1* | 1/2016 | Han | G11C 16/32 365/185.18 |
| 2016/0086967 A1* | 3/2016 | Lee | H01L 27/1159 365/185.18 |
| 2016/0239224 A1 | 8/2016 | Bhavith et al. | |
| 2018/0107384 A1* | 4/2018 | Shin | G06F 3/0607 |

OTHER PUBLICATIONS

International Search Report and Written Opinion—PCT/US2017/056850—ISA/EPO—Jan. 15, 2018.

\* cited by examiner

HARDWARE AUTOMATED LINK CONTROL OF DAISY-CHAINED STORAGE DEVICE

CROSS-REFERENCE TO RELATED APPLICATIONS

The present application for patent claims the benefit of U.S. Provisional Application No. 62/420,935, entitled "H/W AUTOMATED LINK CONTROL OF DAISY-CHAINED STORAGE DEVICE", filed Nov. 11, 2016, assigned to the assignee hereof, and expressly incorporated herein by reference in its entirety.

FIELD OF DISCLOSURE

One or more aspects of the present disclosure generally relate to storage devices, and in particular, to hardware (H/W) automated link control of daisy-chained devices including storage devices.

BACKGROUND

JEDEC (Joint Electron Device Engineering Council) promulgates several standards including the UFS (Universal Flash Storage) standard for high performance mobile storage devices. The UFS has adopted MIPI (Mobile Industry Processor Interface) for data transfer in mobile systems. The UFS is a standard to provide high-performance serial interface for moving data between a host and storage devices.

For example, FIG. 1A illustrates a UFS host 110 that communicates with a UFS device 170 over a link 150. The UFS uses Unipro (Unified Protocol) stack which defines a layered protocol for interconnecting devices within mobile systems. The protocol layers covered by Unipro include the transport layer (L4), the network layer (L3), the data link layer (L2) and the PHY adapter layer (L1.5). These are represented as a Unipro interface 122 on the UFS host 110 and as a Unipro interface 172 on the UFS device 170. M-PHY specifies a physical layer (L1) technique for communication, which are represented as an M-PHY interfaces 124 on the UFS host 110 and as an M-PHY interface 174 on the UFS storage device 170. The PHY adapter layer (L1.5) on the Unipro stack hides the differences among the different physical layer options so that the Unipro can be physical layer agnostic.

A topic of interest regarding storage devices involves daisy-chaining UFS devices so that multiple UFS devices can be connected to the UFS host with a single UFS port. For example, FIG. 1B illustrates first and second UFS devices 170-1, 170-2 daisy-chained to the UFS host 110. The first UFS device 170-1 is point-to-point connected to the UFS host 110 over a first link 150-1. The second UFS device 170-2 is point-to-point connected to the first UFS device 170-1 over a second link 150-2.

The first UFS device 170-1 is illustrated as having a Unipro interface 172U and an M-PHY interface 174U for communication over the first link 150-1. The letter 'U' is used to indicate these are the interfaces on an upstream side of the first UFS device 170-1. The first UFS device 170-1 is also illustrated as having a Unipro interface 172D and an M-PHY interface 174D for communication over the second link 150-2. The letter 'D' is used to indicate these are the interfaces on a downlink side of the first UFS device 170-1. The second UFS device 170-2 is illustrated as having a Unipro interface 172 and an M-PHY interface 174 for communication over the second link 150-2.

Unipro currently supports point-to-point links. In FIG. 1B, this means that the UFS host 110 can directly control the first link 150-1, e.g., through link control commands. However, the UFS host 110 cannot directly control the second link 150-2 between the first and second UFS devices 170-1, 170-2 since the second UFS device 170-2 is not point-to-point connected to the UFS host 110. Instead, the UFS host 110 relies upon the first UFS device 170-1 to control the second link 150-2 on its behalf through issuing normal data/management (D/M) commands.

One disadvantage is that the conventional UFS link control is not consistent for the different links of the daisy-chain. On the host side, device drivers must be written to implement different mechanisms to control the different links. As such, the device drivers can become complex and more prone to errors.

SUMMARY

This summary identifies features of some example aspects, and is not an exclusive or exhaustive description of the disclosed subject matter. Whether features or aspects are included in, or omitted from this summary is not intended as indicative of relative importance of such features. Additional features and aspects are described, and will become apparent to persons skilled in the art upon reading the following detailed description and viewing the drawings that form a part thereof.

An exemplary apparatus is disclosed. The apparatus may comprise a host configured to communicate with a plurality of devices daisy-chained to the host. The host may comprise a host controller, a communication interface, and a link manager. The host controller may be configured to communicate with one or more device drivers. The communication interface may be configured to communicate with the host controller and with the plurality of devices. The link manager may be configured to control a first link between the host and a first device of the plurality of devices. The first device may be point-to-point connected to the host. The host controller may be configured to receive a link control message from a device driver, and determine whether the link control message is for controlling the first link or for controlling a subsequent link. The subsequent link may be a link between two consecutive devices of the plurality of devices point-to-point connected to each other. The host controller may also be configured to send a link control command to the link manager if the link control message is for controlling the first link. The link control command may be equivalent to the link control message for controlling the first link. The host controller may further be configured to send a data/management command to the first device through the communication interface if the link control message is for controlling the subsequent link. The data/management command may be equivalent to the link control message for controlling the subsequent link.

Another exemplary apparatus is disclosed. The apparatus may comprise a host and a plurality of devices daisy-chained to the host. The plurality of devices may comprise a first device that is point to point connected to the host over a first link. The host may comprise a host controller, a communication interface, and a link manager. The host controller may be configured to communicate with one or more device drivers. The communication interface may be configured to communicate with the host controller and with the plurality of devices. The link manager may be configured to control the first link. The host controller may be configured to receive a link control message from a device driver, and determine whether the link control message is for controlling the first link or for controlling a subsequent link. The subsequent link may be a link between two consecutive devices of the plurality of devices point-to-point connected to each other. The host controller may also be configured to send a link control command to the link manager if the link control message is for controlling the first link. The link control command may be equivalent to the link control message for controlling the first link. The host controller may further be configured to send a data/management command to the first device through the communication interface if the link control message is for controlling the subsequent link. The data/management command may be equivalent to the link control message for controlling the subsequent link.

An exemplary method of an apparatus is disclosed. The apparatus may comprise a host and a plurality of devices daisy-chained to the host. The method may comprise receiving, by a host controller of the host, a link control message from a device driver, and determining, also by the host controller, whether the link control message is for controlling a first link or for controlling a subsequent link. The first link may be a link between the host and a first device of the plurality of devices. The first device may be point-to-point connected to the host. The subsequent link may be a link between any two consecutive devices of the plurality of devices point-to-point connected to each other. The method may also comprise sending, by the host controller, a link control command to a link manager of the host if the link control command is for controlling the first link. The link control command may be equivalent to the link control message for controlling the first link. The method may further comprise sending, by the host controller, a data/ management command to the first device through a communication interface of the host if the link control command is for controlling the subsequent link. The communication interface may interface with the first device over the first link. The data/management command may be equivalent to the link control message for controlling the subsequent link. The link manager may be bypassed for sending the data/ management command to the first device.

Yet another exemplary apparatus is disclosed. The apparatus may comprise a host configured to communicate with a plurality of devices daisy-chained to the host. The host may comprise a host controller, a communication interface, and a link manager. The host controller may be configured to communicate with one or more device drivers. The communication interface may be configured to communicate with the host controller and with the plurality of devices. The link manager may be configured to control a first link between the host and a first device of the plurality of devices. The first device may be point-to-point connected to the host. The host controller may comprise means for receiving a link control message from a device driver, and means for determining whether the link control message is for controlling the first link or for controlling a subsequent link. The subsequent link may be a link between two consecutive devices of the plurality of devices point-to-point connected to each other. The host controller may also comprise means for sending a link control command to the link manager if the link control message is for controlling the first link. The link control command may be equivalent to the link control message for controlling the first link. The host controller may further comprise means for sending a data/management command to the first device through the communication interface if the link control message is for controlling the subsequent link. The data/management command may be equivalent to the link control message for controlling the subsequent link.

BRIEF DESCRIPTION OF THE DRAWINGS

The accompanying drawings are presented to aid in the description of examples of one or more aspects of the disclosed subject matter and are provided solely for illustration of the examples and not limitation thereof.

DETAILED DESCRIPTION

Aspects of the subject matter are provided in the following description and related drawings directed to specific examples of the disclosed subject matter. Alternates may be devised without departing from the scope of the disclosed subject matter. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the disclosed subject matter include the discussed feature, advantage or mode of operation.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, processes, operations, elements, and/or components, but do not preclude the presence or addition of one or more other features, integers, processes, operations, elements, components, and/or groups thereof.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the examples described herein, the corresponding form of any such examples may be described herein as, for example, "logic configured to" perform the described action.

One or more aspects of the disclosure may be applied to a system that includes a host and a plurality of devices daisy-chained to the host. Recall from above that one disadvantage (of which there can be several) of a conventional UFS system with a UFS host and multiple UFS devices is that link control is not consistent depending on the location of the link. This is explained with reference to FIGS. 2A, 2B and 2C.

Figure 1A:
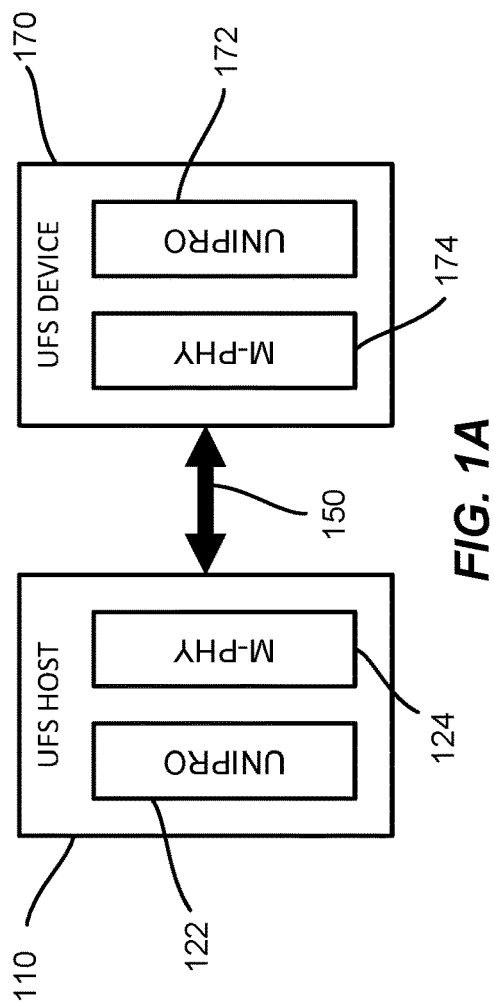
FIG. 1A illustrates a conventional UFS system with a UFS host and a UFS device point-to-point connected to the UFS host.
Figure 1B:
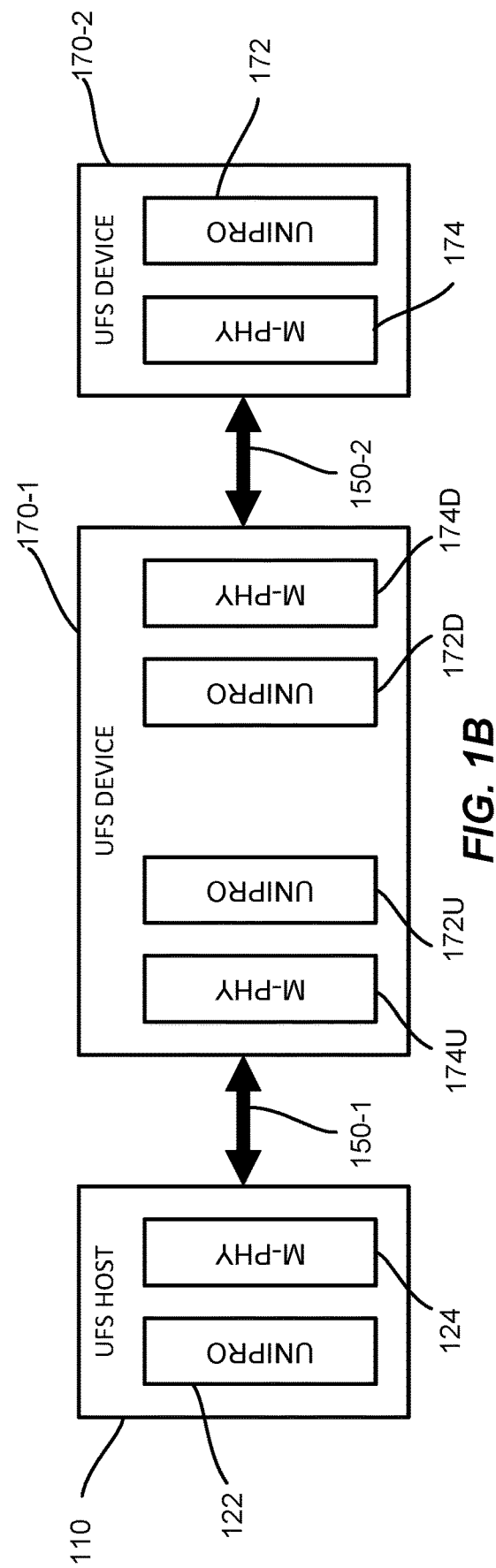
FIG. 1B illustrates a conventional UFS system with a UFS host and multiple UFS devices daisy-chained to the UFS host.
Figure 2A:
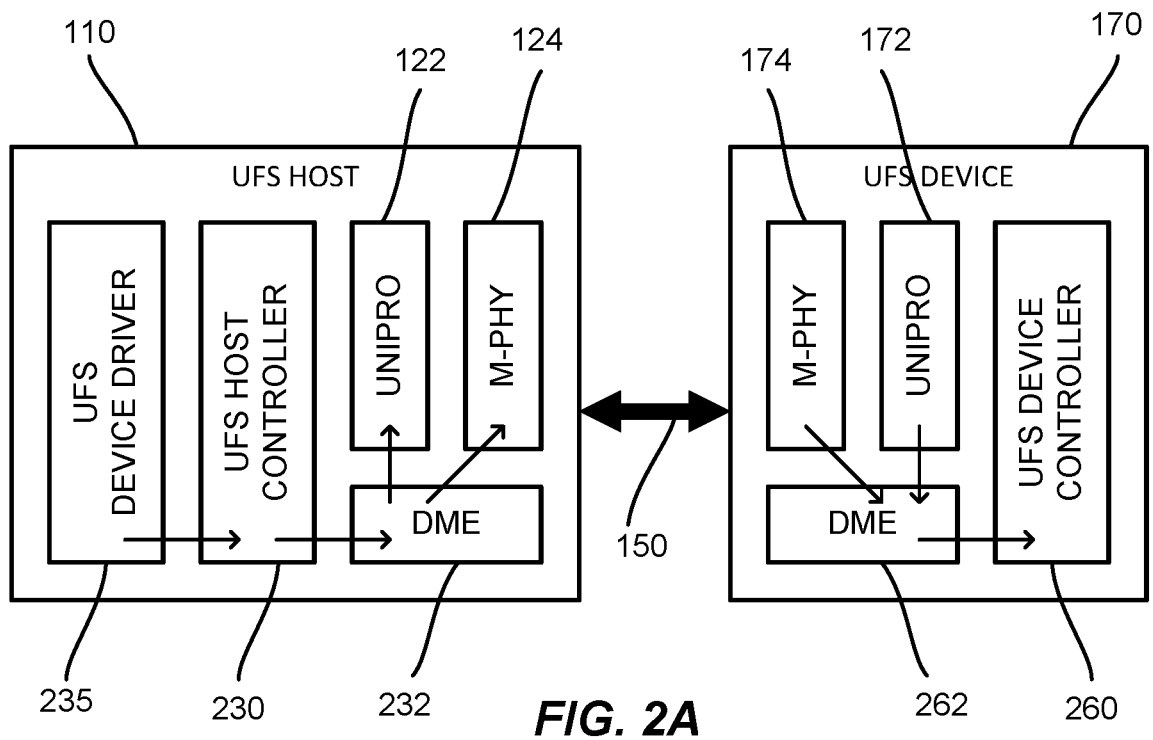
FIG. 2A illustrates a conventional flow of signals for controlling a link between a UFS host and a UFS device point-to-point connected to the UFS host.

FIG. 2A illustrates a diagram showing a conventional flow of signals for controlling a link 150 between a UFS host 110 and a point-to-point connected UFS device 170 utilizing Unipro. The UFS host 110 includes a UFS device driver 235, a UFS host controller 230, a data management entity (DME) 232, a Unipro interface 122, and an M-PHY interface 124. The UFS device 170 includes a UFS device controller 260, a DME 262, a Unipro interface 172, and an M-PHY interface 174.

In UFS, the physical link control (e.g., link start up, mode change, hibernation, etc.) is controlled by the DME. To control the link 150, the UFS device driver 235 at the UFS host 110 issues a DME command to the UFS host controller 230. For example, when the UFS host 110 is powered up, the UFS device driver 235 issues a link start up command. The UFS host controller 230 then controls the DME 232 for link control. The DME 232 configures the Unipro and the M-PHY interfaces 122, 124 to establish and control the link 150. Status is reported to the UFS device driver 235 as a DME status. For example, the DME status indicates whether or not the link 150 has been successfully established.

As seen, on the UFS host 110 side, the link control signal flow is from the UFS device driver 235→the UFS host controller 230→the DME 232→the Unipro and M-PHY interfaces 122, 124. On the UFS device 170 side, the link control signal flow is the reverse to that of the UFS host 110, i.e., from the M-PHY and Unipro interfaces 174, 172→the DME 262→the UFS device controller 260.

Figure 2B:
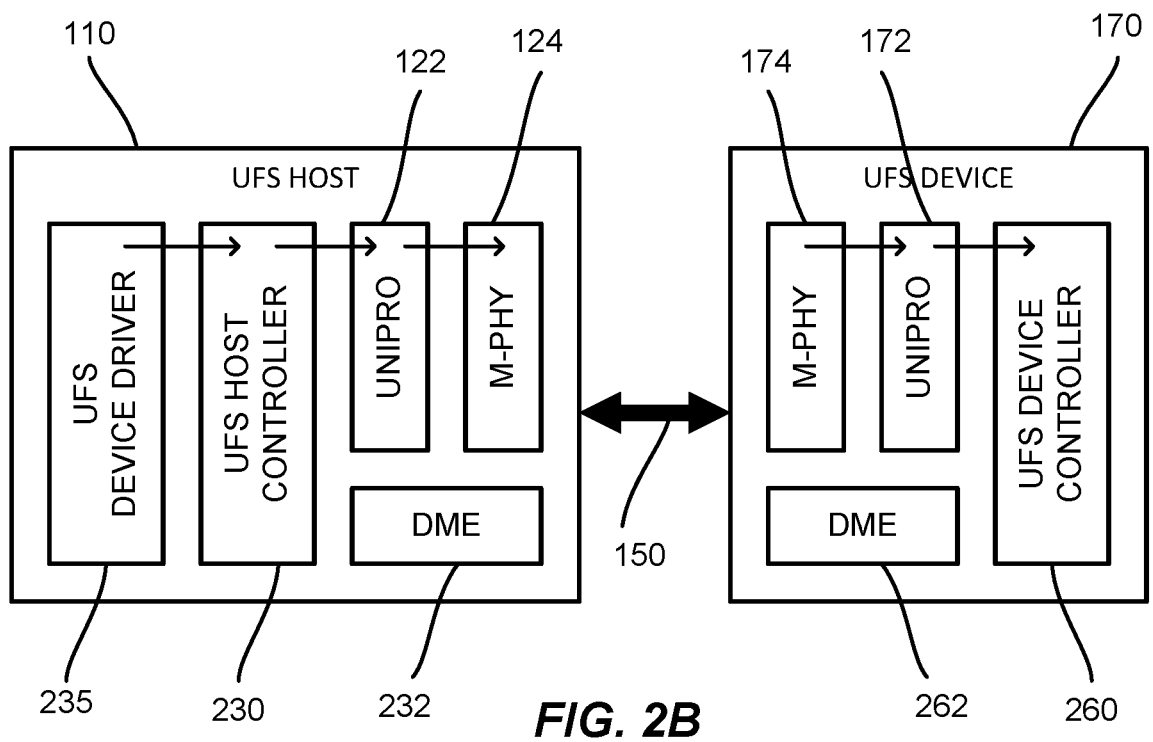
FIG. 2B illustrates a conventional flow of signals for exchanging data on a link that has been established between a UFS host and a UFS device point-to-point connected to the UFS host.

Once the link 150 is established, the UFS device driver 235 issues a normal data and management message as seen in FIG. 2B. For example, the UFS device driver 235 may issue request messages to read from and write to a storage (not shown) in the UFS device 170. The UFS host controller 230 then issues the data/management (D/M) command to the Unipro interface 122, and the D/M command is ultimately provided to the UFS device 170 over the link 150. Status is reported back to the UFS device driver 235 as a normal command status. For example, if the normal command is a write command, the status would indicate whether or not the UFS device 170 successfully performed the write operation.

On the UFS host 110 side, the normal D/M signal flow is from the UFS device driver 235→the UFS host controller 230→the Unipro interface 122→the M-PHY interface 124. On the UFS device 170 side, the normal D/M signal flow is from the M-PHY interface 174→the Unipro interface 172→the UFS device controller 260. Again, for normal commands, the DME 262 is not involved.

Figure 2C:
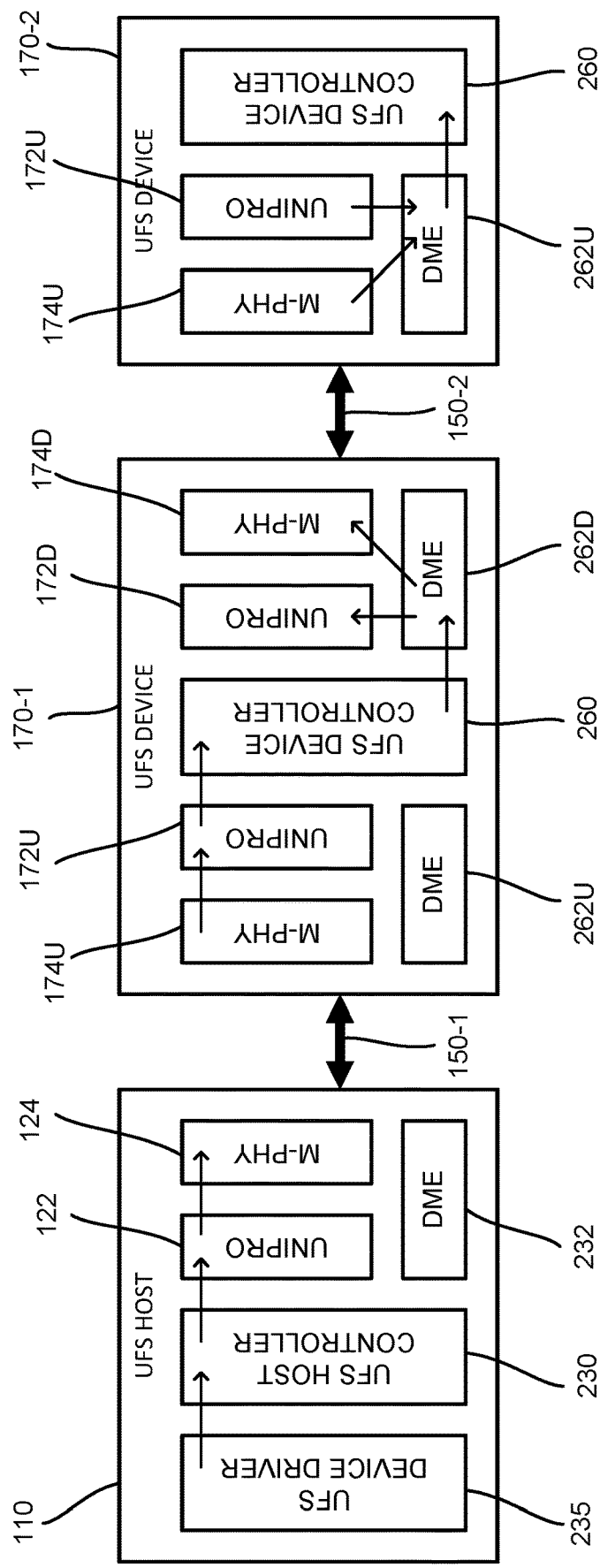
FIG. 2C illustrates a conventional flow of signals for controlling a link in a chain of a plurality of UFS devices daisy-chained to a UFS host.

When there are multiple UFS devices daisy-chained to the UFS host, the UFS host cannot directly control the UFS device that is not immediately connected to the UFS host. This is because the current standard only allows link control of point-to-point connected devices. This is explained with reference to FIG. 2C which illustrates first and second UFS devices 170-1, 170-2 daisy-chained to the UFS host 110. FIG. 2C shows a first link 150-1 point-to-point connecting the UFS host 110 with the first UFS device 170-1. FIG. 2C also shows a second link 150-2 point-to-point connecting the first UFS device 170-1 with the second UFS device 170-2.

The UFS host 110 in FIG. 2C is assumed to be the same as the UFS host 110 in FIGS. 2A and 2B, i.e., it includes the UFS device driver 235, the UFS host controller 230, the DME 232, the Unipro interface 122, and the M-PHY interface 124. Therefore, detailed descriptions of these components are not repeated.

The first UFS device 170-1 includes an upstream M-PHY interface 174U, an upstream Unipro interface 172U, an upstream DME 262U, a UFS device controller 260, a downlink DME 262D, a downlink Unipro interface 172D and a downlink M-PHY interface 174D. The second UFS device 170-2 includes an M-PHY interface 174D, a Unipro interface 172D, and a DME 262D.

Normally, it is desirable for the host to control all aspects of communication between the host and connected devices. However, as mentioned, the current UFS standard only allows link control of point-to-point connected devices. This means that in FIG. 2C, the UFS host 110 can directly control only the first link 150-1.

To control the second link 150-2 between the first and second UFS devices 170-1, 170-2, the UFS host 110 sends a normal management command to the first UFS device 170-1. The UFS device controller 260 of the first UFS device 170-1 decodes the management command, and starts the DME control for the second link 150-2. In effect, the UFS host 110 delegates the control of the second link 150-2 to the first UFS device 170-1.

There are several problems with the existing ways of controlling links. First, link control is not consistent for the different links of the daisy-chain, at least from the perspective of the UFS device driver 235. Under the existing specification, the control of the first link 150-1 is accomplished using the standardized link control mechanism through the DME 232 of the UFS host 110. On the other hand, control of the second link 150-2 is accomplished using the data/management command mechanism. Status is reported back to the UFS device driver 235 of the UFS host 110 as a normal command status.

Second, the UFS device driver 235 on the UFS host 110 must be re-written to implement different link control and different status checking to deal with the inconsistencies of the link control mechanisms. This means that the device drivers, which are typically software-based, become more complex and thus prone to more errors. Third, when there are more than two daisy-chained UFS devices, the control mechanism may become even more inconsistent.

In an aspect, it is proposed to provide a consistent view for the device drivers for link control. This can allow the device drivers to be simplified. For example, it is proposed to enable a device driver of a host to view all external devices as if each is point-to-point connected to the host even though the devices may be daisy-chained to the host.

Figure 3:
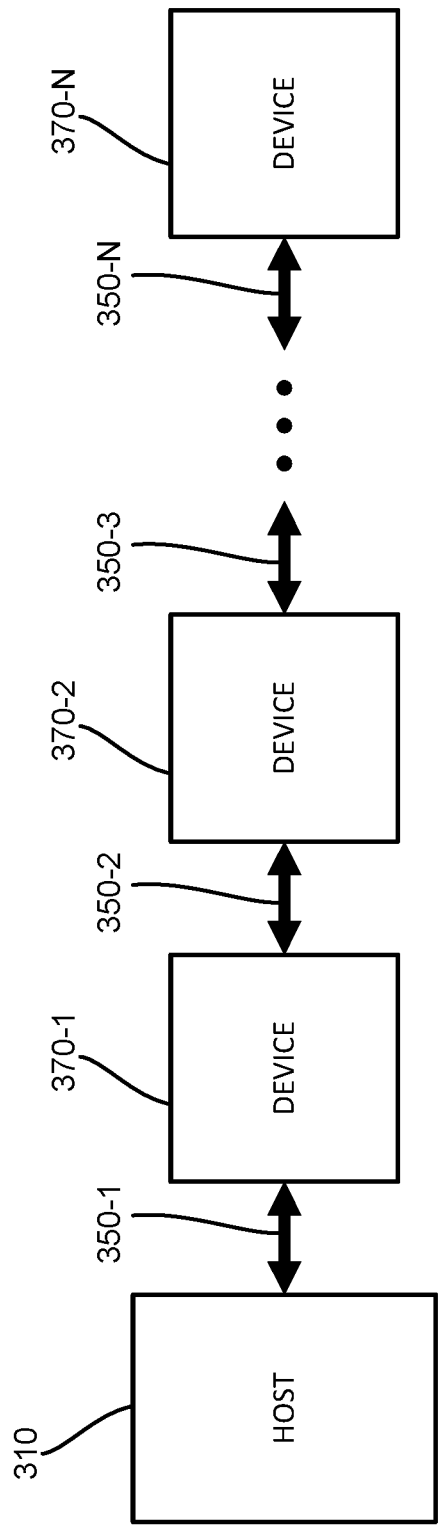
FIG. 3 illustrates an example of a host and a plurality of devices daisy-chained to the host according to an aspect.

FIG. 3 illustrates an example of a system or an apparatus that includes a host 310 and a plurality of devices 370 external to the host 310. The plurality of devices 370 may be daisy-chained to host 310 over a plurality of links 350. The number of daisy-chained devices 370 may be N, where N≥2. There may also be at least a same number N of links 350.

For clarity, the devices 370-1, 370-2, . . . 370-N may be respectively referred to as the first device 370-1, the second device 370-2, . . . the Nth device 370-N. Similarly, the links 350-1, 350-2, 350-3, . . . 350-N may be respectively referred to as the first link 350-1, the second link 350-2, the third link 350-3 . . . the Nth link 350-N. As seen, the first device 370-1 may be point-to-point connected to the host 310 over the first link 350-1. All other links 350-$n$ (n=2, 3, . . . N), i.e., all subsequent links 350, may be links between two consecutive devices 370 point-to-point connected to each other. In FIG. 3, the second link 350-2 may be an example of a subsequent link 350. In general, each subsequent link 350-$n$ (n=2, 3, . . . N) may represent a point-to-point connection between consecutive devices 370-($n$−1) and 370-$n$.

When there are multiple devices 370 daisy-chained to the host 310, i.e., when N≥2, there can be one or more intermediate devices 370-$n$, (n=1, 2, . . . N−1). In this aspect, an intermediate device 370-$n$ may be defined as a device 370 in between the host 310 and the last device 370-N in the chain. Then each intermediate device 370-$n$, a previous device 370-($n$−1) may be immediately upstream and a next device 370-($n$+1) may be immediately downstream. Thus, each intermediate device 370-$n$ may directly communicate (i.e., be point-to-point connected with) the previous device 370-($n$−1) over a previous link 350-$n$. Also, each intermediate device 370-$n$ may directly communicate (i.e., be point-to-point connected with) the next device 370-($n$+1) over a next link 350-($n$+1). In the case of the first device 370-1, the previous device may be the host 310, the previous link may be the first link 350-1, the next device may be the second device 370-2, and the next link may be the second link 350-2.

Recall that there are several drawbacks with the conventional ways of controlling the daisy-chained links. The drawbacks are primarily due to the link control being inconsistent for different links. For example, with reference FIGS. 2A-2C, for the UFS host 110 to control the link of the point-to-point connected device (e.g., the first link 150-1 between the UFS host 110 and the first UFS device 170-1), the UFS device driver 235 must issue a DME message (e.g., see FIG. 2A). On the other hand, to control a subsequent link (e.g., the second link 150-2), the UFS device driver 235 must issue a normal management message (e.g., see FIG. 2C). In other words, the UFS device driver 235 must differentiate among the links 150, and issue different sets of messages based on the differentiation. As a result, the existing link control mechanism forces the UFS device drivers 235 at the UFS host 110 to be more complex and thus more error prone.

To address some or all issues of the existing link control mechanisms, it is proposed to provide a uniform view to the device drivers at the host for link control. For example, with reference to FIG. 3, under the proposed mechanism, a device driver at the host 310 may issue a same set of link control messages to control a link regardless of whether the link is the first link 350-1 or any of the subsequent links 350-$n$. To exchange data with a device 370, the device driver may issue a same set of normal data/management messages. By presenting a consistent view, the device driver may be simplified. Indeed, existing device drivers may be used with little to no modifications.

Figure 4A:
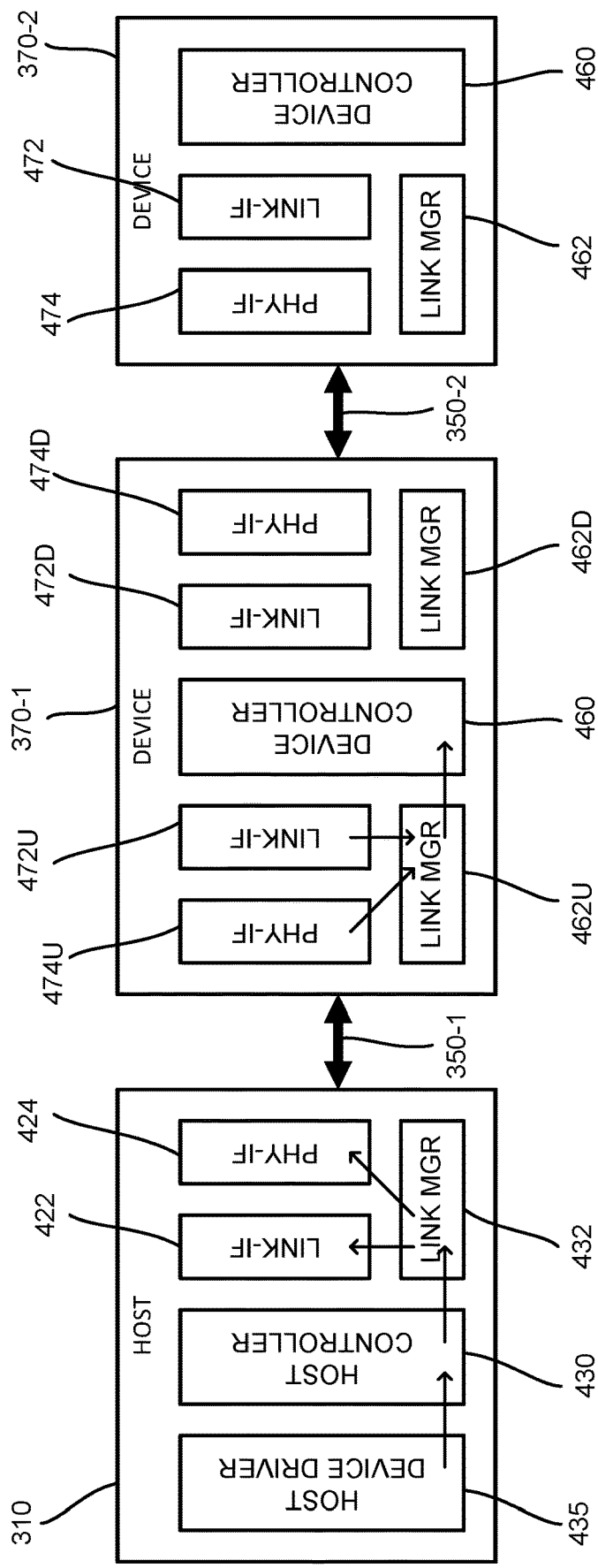
FIGS. 4A and 4B illustrate example flows of signals for controlling a link in a chain between a host and a plurality of devices daisy-chained to the host according to an aspect.
Figure 4B:
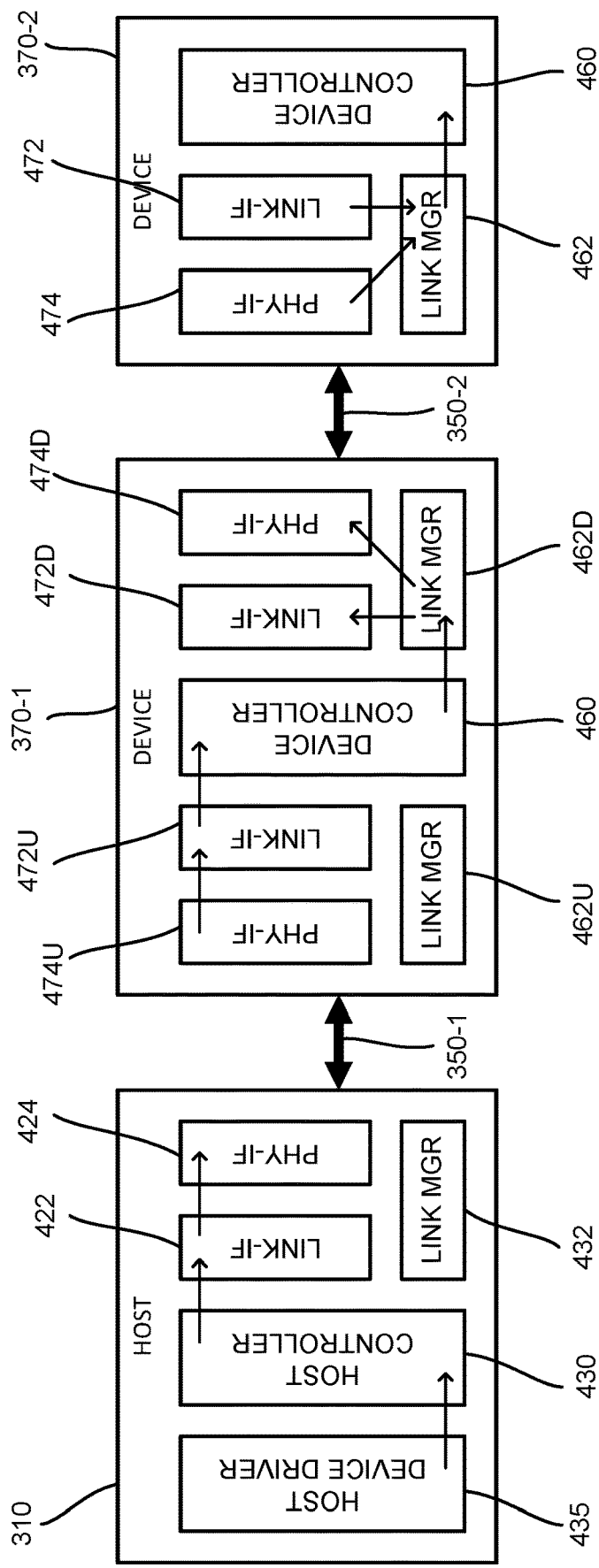

FIGS. 4A and 4B illustrate example flows of signals for controlling such a link according to an aspect of a proposed link control mechanism. In particular, FIG. 4A illustrates an example flow of signals when a point-to-point link (e.g., the first link 350-1) is targeted, and FIG. 4B illustrates an example flow of signals when a subsequent link (e.g., the second link 350-2) is targeted. Details are discussed further below with reference to FIGS. 5-8.

For ease of explanation, two devices 370 (N=2) are illustrated to be connected to the host 310 in both FIGS. 4A and 4B. However, N can also be any integer number greater than 2. The host 310 may be an application processor or a system-on-chip (SoC) device. The host 310 can be any type that utilizes storage including UFS storage memory. Examples include, among others, application processors (AP), application specific integrated circuits (ASICs), and micro controllers.

The first and second devices 370-1, 370-2 may be daisy-chained to the host 310. The first device 370-1 may be point-to-point connected to the host 310 over the first link 350-1 and the second device 370-2 may be point-to-point connected to the first device 370-1 over the second link 350-2. The host 310 may include a host controller 430, a link manager 432, a link interface 422, and a PHY interface 424. Each of the host controller 430, the link manager 432, the link interface 422, and the PHY interface 424 may be implemented in hardware or in a combination of hardware and software.

The link interface 422 may be configured to communicate with the PHY interface 424, the host controller 430 and the link manager 432. An example of the link interface 422 may be a Unipro interface configured to operate in compliance with the UFS standard. The PHY interface 424 may be configured to communicate with the link interface 422, the link manager 432 and the first device 370-1 over the first link 350-1. An example of the PHY interface 424 may be an M-PHY interface configured to operate in compliance with the UFS standard. Of course, other physical interfaces are possible such as D-PHY and C-PHY.

The link interface 422 and the PHY interface 424 together may be referred to as a communication interface. The communication interface may be configured to provide interconnect functionalities to facilitate communication between the host 310 and the plurality of devices 370.

The link manager 432 may be configured to communicate with the communication interface (the link interface 422 and/or the PHY interface 424) to control the first link 350-1. The link manager 432 may also be configured to communicate with the host controller 430. An example of the link manager 432 may be a device management entity (DME) configured to operate in compliance with the UFS standard.

On the host 310 side, there may be one or more device drivers 435, and each device driver 435 may be configured to issue link control messages (e.g., link startup, mode change, hibernation, etc.) to control the links 350, and to issue normal messages (e.g., read, write, management, etc.) to communicate with the plurality of devices 370.

For simplicity, FIGS. 4A and 4B illustrate a single device driver 435 being included in the host 310. However, it should be recognized that there can be multiple device drivers 435. The device driver 435 may be implemented in hardware or in a combination of hardware and software. In one aspect, the host 310 may be a processor (e.g., application processor, CPU core, etc.) executing device driver instructions stored in a memory (not shown). In another aspect, the host controller 430 may communicate with a device driver 435 that is external to the host 310, i.e., the device driver 435 is NOT required to be a part of the host 310. For example, the host 310 may be a system-on-chip (SoC) that communicates with an application processor executing the device driver instructions.

The host controller 430 may be configured to communicate with the device driver 435. As indicated above, the device driver 435 may issue two types of messages to the host controller 430—a link control message (e.g., a DME command) to control the plurality of links 350 and a normal (e.g., data, management) message.

The first device 370-1 may include a device controller 460 that may be configured to control an overall operation of the first device 370-1. The first device 370-1 may also include an upstream PHY interface 474U, an upstream link interface 472U, an upstream link manager 462U, a downstream link manager 462D, a downstream link interface 472D and a downstream PHY interface 474D. Each of the device controller 460, the upstream and downstream link managers 462U, 462D, the upstream and downstream link interfaces 472U, 472D, and the upstream and downstream PHY interfaces 474U, 474D may be implemented in hardware or in a combination of hardware and software.

The upstream link interface 472U and the upstream PHY interface 474U together may be referred to as an upstream communication interface. Also, the downstream link interface 472D and the downstream PHY interface 474D together may be referred to as a downlink communication interface. The upstream and downstream communication interfaces may be configured to provide interconnect functionalities to facilitate communication with the host 310 and other devices 370 of the plurality of devices 370.

The upstream PHY interface 474U may be configured to communicate with the upstream link interface 472U, the upstream link manager 462U and the host 310 over the first link 350-1. The downstream PHY interface 474D may be configured to communicate with the downstream link interface 472D, the downlink manager 462D and the second device 370-2 over the second link 350-2. More generally, the upstream PHY interface 474U of an intermediate device 370-n, may be configured to communicate with the previous device 370-(n−1) over the previous link 350-n, and the downstream PHY interface 474D may be configured to communicate with the next device 370-(n+1) over the next link 350-(n+1). The upstream and downstream PHY interfaces 474U, 474D may be M-PHY interfaces configured to operate in compliance with the UFS standard. Of course, other physical interfaces are possible such as D-PHY and C-PHY.

The upstream link interface 472U may be configured to communicate with the upstream PHY interface 474U, the device controller 460 and the upstream link manager 462U. The downstream link interface 472D may be configured to communicate with the downstream PHY interface 474D, the device controller 460 and the downlink manager 462D. The upstream and downstream PHY interfaces 472U, 472D may be Unipro interfaces configured to operate in compliance with the UFS standard.

The upstream link manager 462U may be configured to communicate with the upstream link interface 472U, the upstream PHY interface 474U and the device controller 460. The downlink manager 462D may be configured to communicate with the downstream link interface 472D, the downstream PHY interface 474D and the device controller 460. The upstream and downstream link managers 462U, 462D may be device management entities (DME) configured to operate in compliance with the UFS standard.

The second device 370-2 may include a device controller 460 that may be configured to control an overall operation of the second device 370-2. The second device 370-2 may also include a PHY interface 474, a link interface 472, and a link manager 462. Each of the device controller 460, the link manager 462, the link interface 472, and the PHY interface 474 may be implemented in hardware or in a combination of hardware and software.

The link interface 472 and the PHY interface 474 together may be referred to as a communication interface. The communication interface may be configured to provide interconnect functionalities to facilitate communication with the host 310 and with other devices 370 of the plurality of devices 370. The PHY interface 474 may be configured to communicate with the link interface 472, the link manager 462 and the first device 370-1 over the second link 350-2. The PHY interface 474 may be an M-PHY interface configured to operate in compliance with the UFS standard. Of course, other physical interfaces are possible such as D-PHY and C-PHY.

The link interface 472 may be configured to communicate with the PHY interface 474, the device controller 460 and the link manager 462. The link interface 472 may be a Unipro interface configured to operate in compliance with the UFS standard. The link manager 462 may be configured to communicate with the link interface 472, the PHY interface 474 and the device controller 460. The link manager 462 may be a DME configured to operate in compliance with the UFS standard.

In an aspect, the second device 370-2 may be configured similarly to the first device 370-1. For example, the PHY interface 474, the link interface 472, and the link manager 462 of the second device 370-2 may behave similarly to the upstream PHY interface 474U, the upstream link interface 472U, and the upstream link manager 462U of the first device 370-1. Note that the second device 370-2 may also include the downstream PHY interface, the downstream link interface, and the downlink manager. However, since the second device 370-2 is the last device in the chain in FIGS. 4A and 4B, these elements are omitted so as to minimize clutter.

In an aspect, it is proposed to provide a uniform view to the device driver 435 for controlling the links 350. For example, the first device 370-1 and each subsequent device 370-n (n=2, 3, . . . N) may appear to be a point-to-point connected device from the perspective of the device driver 435 of the host 310. When such uniform view is provided, the device driver 435 may always issue the same set of link control messages to control a link 350 regardless of whether the targeted link is the first link 350-1 or any of the subsequent links 350-n, n≠1.

Figure 5:
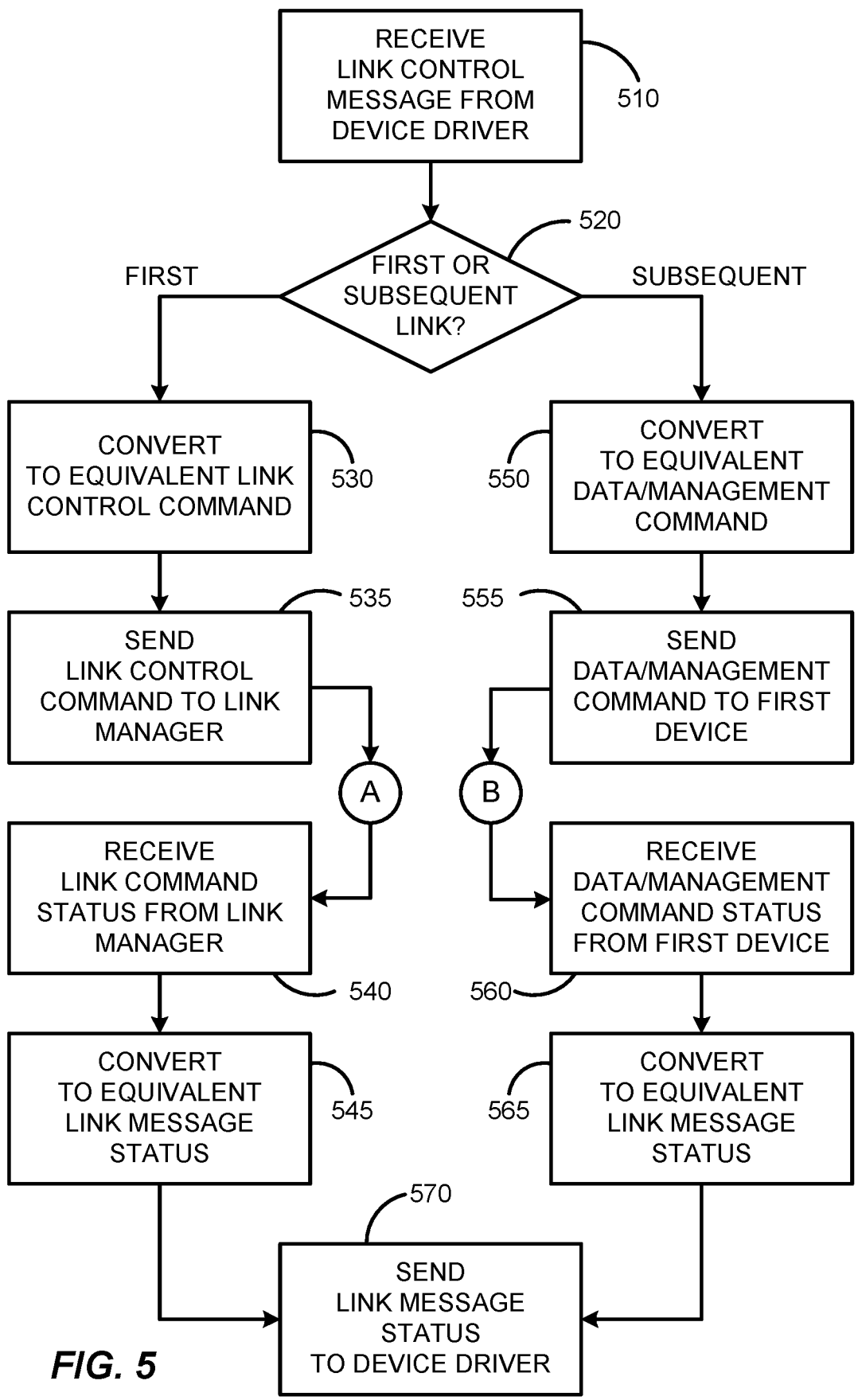
FIGS. 5-8 illustrate flow charts of an example method for controlling a link in a chain between a host and a plurality of devices daisy-chained to the host according to an aspect.

Details are explained with reference to FIGS. 5-8 which illustrate an example method for link control. FIG. 5 illustrates a flow chart of example operations performed by the host controller 430. In block 510, the host controller 430 may receive a link control message from the device driver 435. In block 520, the host controller 430 may determine whether the link control message is for controlling the first link 350-1 or a subsequent link 350-n, n≠1.

The target link may be determined in a multitude of ways. In an aspect, the link control message from the device driver 435 may include a device identification (id) identifying the host 310 or one of the plurality of devices 370, and the target link may be determined based on the device id. For example, the host controller 430 may determine that the first link 350-1 is the target link if the device id identifies or otherwise corresponds to the host 310. On the other hand, the host controller 430 may determine that the subsequent link 350-$n$ is the target link if the device id does not identify or otherwise does not correspond to the host 310.

Depending on the recognized target link, the host controller 430 may take appropriate actions. In a first scenario, the host controller 430 in block 520 may determine that the link control message is for controlling the first link 350-1. This is the scenario illustrated in FIG. 4A. For example, the host controller 430 may recognize that the target link is the first link 350-1, i.e., a link to a device 370 that is point-to-point connected to the host 310. If the first link 350-1 is the target link, then in block 530, the host controller 430 may convert the link control message into an equivalent link control command. In block 535, the host controller 430 may send the link control command to the link manager 432. In FIG. 5, this is indicated by an arrow exiting block 535 to a circled "A".

Figure 6:
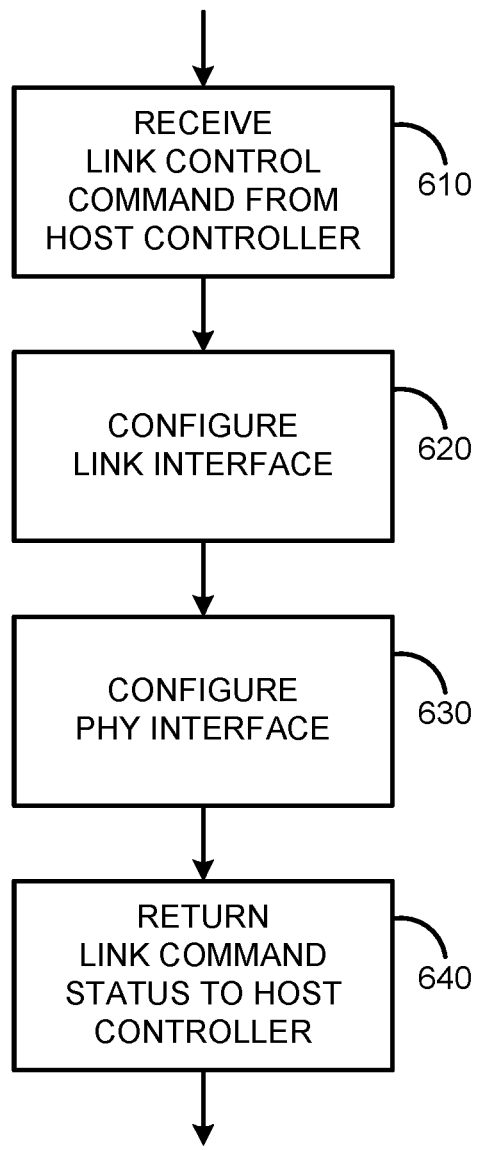

FIG. 6 illustrates a flow chart of example operations performed by the link manager 432 when the host controller 430 determines that the target link is the first link 350-1. In block 610, the link manager 432 may receive the link control command from the host controller 430. In response to receiving the link control command, the link manager 432 may configure the communication interface. For example, in block 620, the link manager 432 may configure the link interface 422, and in block 630, the link manager 432 may configure the PHY interface 424 to control the first link 350-1. For example, if the link control command is a "link startup" command, the link manager 432 may configure the link interface 422 and/or the PHY interface 424 to establish the first link 350-1 to the first device 370-1. In block 640, the link manager 432 may report a link command status corresponding to the link control command back to the host controller 430. The link command status may indicate a result of the operation performed in accordance with the link control command. For example, the link command status may indicate whether or not the first link 350-1 has been successfully established.

Referring back to FIG. 5, in block 540, the host controller 430 may receive the link command status from the link manager 432. This is indicated by an arrow entering block 540 from the circled "A". In block 545, the host controller 430 may convert the link command status to an equivalent link message status. In block 570, the host controller 430 may send the link message status to the device driver 435.

However, in a second scenario, the host controller 430 in block 520 may determine that the link control message is for controlling the second link 350-2, i.e., for controlling a subsequent link 350-$n$, $n \neq 1$ (a link between two consecutive devices 370). This is the scenario illustrated in FIG. 4B. For example, the host controller 310 may recognize that the target link is a link to device 370 that is NOT point-to-point connected to the host 310, e.g., if the device id does not identify or otherwise does not correspond to the host 310.

Since the target is not the first link 350-1, the host controller 430 need not involve the link manager 432, i.e., the link manager 432 can be bypassed. Instead, in block 550, the host controller 430 may convert the link control message to a data/management (D/M) command that is equivalent to the link control message. In block 555, the host controller 430 may send the D/M command to the first device 370-1 through the communication interface. In FIG. 5, this is indicated by an arrow exiting block 555 to a circled "B". For example, the D/M command may be provided to the link interface 422, which in turn may forward the D/M command to the PHY interface 424. The PHY interface 424 may transmit the D/M command to the first device 370-1 over the first link 350-1.

Figure 7:
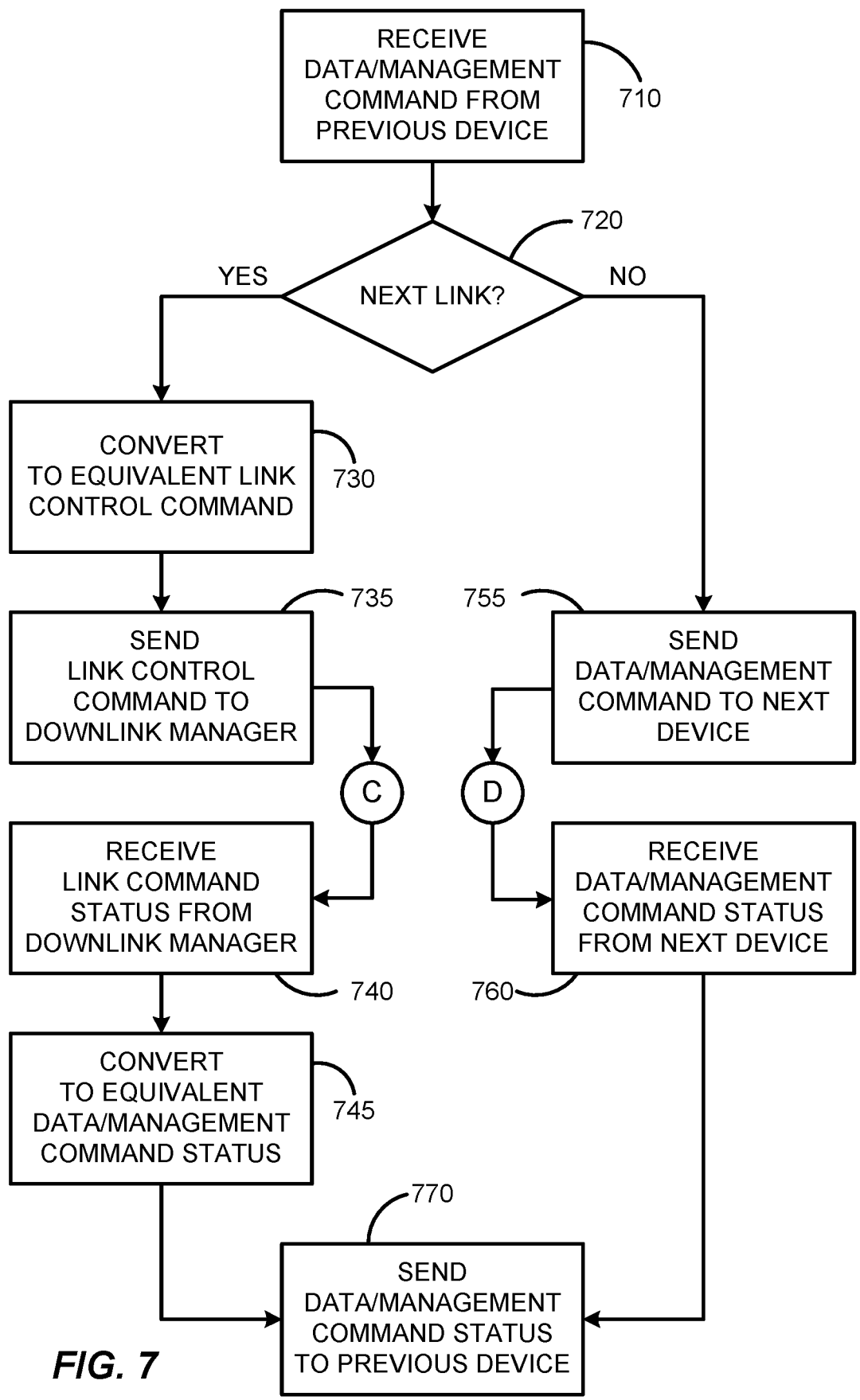

FIG. 7 illustrates a flow chart of example operations performed by the first device 370-1 when the host controller 430 determines that the target link is the subsequent link 350-$n$, $n \neq 1$. Recall from above that the first device 370-1 is an example of an intermediate device 370-$n$. Therefore, the flow chart of FIG. 7 will be described keeping this in mind. In block 710, the device controller 460 may receive the D/M command from the previous device 370-($n$−1) through the upstream communication interface. For example, the upstream PHY interface 474U may receive the D/M command from the previous device 370-($n$−1) over the previous link 350-($n$) and forward the D/M command to the upstream link interface 472U. The upstream link interface 472U may in turn provide the D/M command to the device controller 460. In the case of the first device 370-1, the previous device is the host 310 and the previous link is the first link 350-1.

In block 720, the device controller 460 may determine whether the D/M command is for controlling the next link 350-($n$+1). In an aspect, the D/M command may include the device id originally provided by the device driver 435 of the host 310. The device controller 460 may determine that the next link 350-($n$+1) is the target link if the device id identifies or otherwise corresponds to the intermediate device 370-$n$. Otherwise, the device controller 460 may determine that the next link 350-($n$+1) is not the target link. In the case of the first device 370-1, the next link is the second link 350-2.

If the device controller 460 in block 720 determines that the next link 350-($n$+1) is the target link, then in block 730, the device controller 460 may convert the D/M message into an equivalent link control command. In block 735, the device controller 460 may send the link control command to the downlink manager 462D. In FIG. 7, this is indicated by an arrow exiting block 735 to a circled "C".

Figure 8:
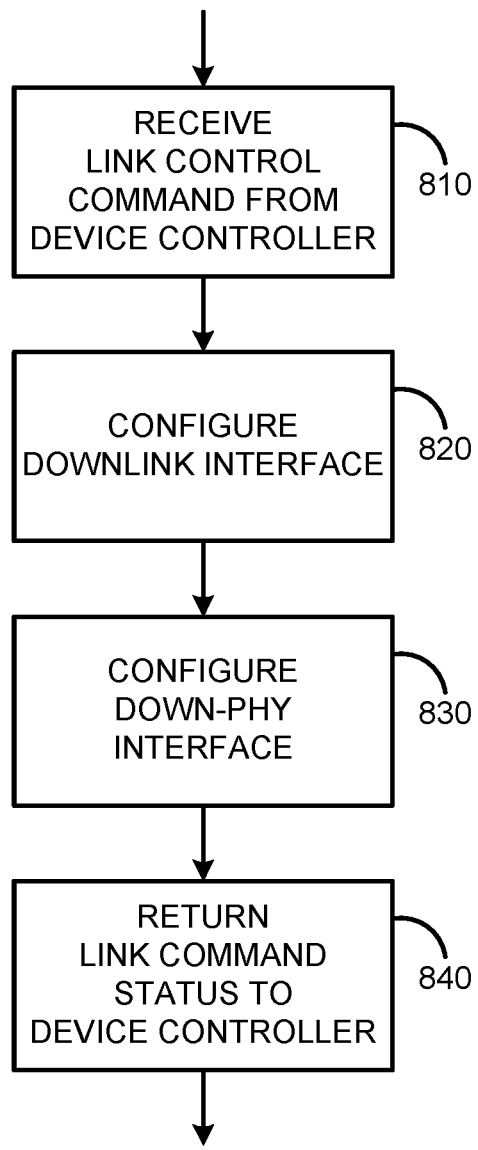

FIG. 8 illustrates a flow chart of example operations performed by the downlink manager 462D of the intermediate device 370-$n$. In block 810, the downlink manager 462D may receive the link control command from the device controller 460. Upon receiving the link control command, the downlink manager 462D may configure the downlink communication interface. For example, in block 820, the downlink manager 462D may configure the downstream link interface 472D, and in block 830, the downlink manager 462D may configure the downstream PHY interface 474D to control the next link 350-($n$+1). For example, if the link control command is a "link startup" command, the downlink manager 462D may configure the downstream link interface 472D and/or the downstream PHY interface 474D to establish the next link 350-($n$+1) to the next device 370-($n$+1). In block 840, the downlink manager 462D may return a link command status corresponding to the link control command back to the device controller 460. The link command status may indicate a result of the operation performed in accordance with the link control command. For example, the link command status may indicate whether or not the next link 350-($n$+1) has been successfully established.

Referring back to FIG. 7, in block 740, the device controller 460 may receive the link command status from the downlink manager 462D. In FIG. 7, this is indicated by an arrow entering block 740 from the circled "C". In block 745, the device controller 460 may convert the link command status to an equivalent D/M command status. In block 770, the device controller 460 may send the D/M command status to the previous device 370-($n$−1) through the upstream communication interface. For example, the device controller 460 may provide the D/M command status to the upstream link interface 472U, which in turn may forward the D/M command status to the upstream PHY interface 474U. The upstream PHY interface 474U may transmit the D/M command status to the previous device 370-($n$−1) over the previous link 350-$n$.

Remaining in FIG. 7, if the device controller 460 in block 720 determines that the next link 350-($n$+1) is not the target link, then in block 755, the device controller 460 may send the D/M command to the next device 370-($n$+1) through the downlink communication interface. For example, the device controller 460 may provide the D/M command to the downstream link interface 472D, which in turn may forward the D/M command to the downstream PHY interface 474D. The downstream PHY interface 474D may transmit the D/M command to the next device 370-($n$+1) over the next link 350-($n$+1). In FIG. 7, this is indicated by an arrow exiting block 755 to a circled "D".

The next device 370-($n$+1) may perform the operations illustrated in FIGS. 7 and 8. That is, the next device 370-($n$+1) may perform operations to control the target link if the target link is its next link 350-($n$+2). Otherwise, the next device 370-($n$+1) may forward the D/M command to its next device 370-($n$+2).

Eventually, the D/M command status may be returned to the intermediate device 370-$n$. In FIG. 7, this is indicated by an arrow entering block 760 from the circled "D". In block 760, the device controller 460 may receive the D/M command status from the next device 370-($n$+1) through the downlink communication interface. For example, the downstream PHY interface 474D may receive the D/M command status from the next device 370-($n$+1) over the next link 350-($n$+1), which in turn may forward the D/M command status to the downstream link interface 472D. Then, the downstream link interface 472D may provide the D/M command status to the device controller 460. In block 770, the device controller 460 may send the D/M command status to the previous device 370-($n$−1) through the upstream communication interface.

Referring back to FIG. 5, ultimately, the first device 370-1 may return the D/M command status to the host 310. In FIG. 5, this is indicated by an arrow entering block 560 from the circled "B". In block 560, the host controller 430 may receive the D/M command status from the first device 370-1 through the communication interface. For example, the PHY interface 424 may receive the D/M command status from the first device 370-1 over the first link 350-1, which in turn may forward the D/M command status to the link interface 422. The link interface 422 may provide the D/M command status to the host controller 430. In block 565, the host controller 430 may convert the D/M command status to an equivalent link message status. In block 570, the host controller 430 may send the link message status to the device driver 435. The link manager 432 need not be involved when the D/M command status is returned to the host controller 430, i.e., the link manager 432 can be bypassed.

Note that in both scenarios, the device driver 435 can issue the same set of link control messages for both the first link 350-1 and the second link 350-2. In other words, the host controller 430 can provide a consistent view such that from the perspective of the device driver 435, both the first and second devices 370-1, 370-2 appear as point-to-point connected devices. Generalizing this to FIG. 3, each device 370-$n$ of the daisy-chained devices 370 can appear to be point-to-point connected from the perspective of the device driver 435. Therefore, the device driver 435 can issue the same set of link control commands to control the links 350 regardless of whether the target link is the first link 350-1 or a subsequent link 350-$n$.

Figure 9:
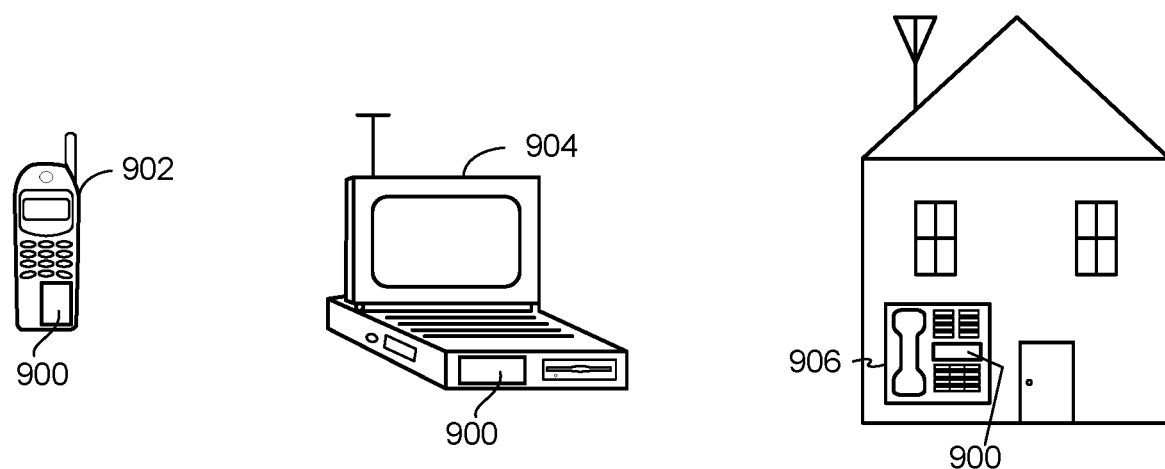
FIG. 9 illustrates examples of devices with a host and a plurality of devices daisy-chained to the host integrated therein.

FIG. 9 illustrates various electronic devices that may be integrated with the aforementioned apparatuses illustrated in FIGS. 4A and 4B. For example, a mobile phone device 902, a laptop computer device 904, a terminal device 906 as well as wearable devices, portable systems, that require small form factor, extreme low profile, may include a device/package 900 that incorporates the apparatuses as described herein. The device/package 900 may be, for example, any of the integrated circuits, dies, integrated devices, integrated device packages, integrated circuit devices, device packages, integrated circuit (IC) packages, package-on-package devices, system-in-package devices described herein. The devices 902, 904, 906 illustrated in FIG. 9 are merely exemplary. Other electronic devices may also feature the device/package 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithms described in connection with the examples disclosed herein may be implemented as electronic hardware, computer software, or combinations of both. To clearly illustrate this interchangeability of hardware and software, various illustrative components, blocks, modules, circuits, and methods have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled with the processor such that the processor can read information from, and write information to, the storage medium. In the alternative, the storage medium may be integral to the processor.

Accordingly, an aspect can include a computer-readable media embodying any of the devices described above.

Accordingly, the scope of the disclosed subject matter is not limited to illustrated examples and any means for performing the functionality described herein are included.

While the foregoing disclosure shows illustrative examples, it should be noted that various changes and modifications could be made herein without departing from the scope of the disclosed subject matter as defined by the appended claims. The functions, processes and/or actions of the method claims in accordance with the examples described herein need not be performed in any particular order. Furthermore, although elements of the disclosed subject matter may be described or claimed in the singular, the plural is contemplated unless limitation to the singular is explicitly stated.

What is claimed is:

1. An apparatus, comprising:
a host configured to communicate with a plurality of devices daisy-chained to the host,
wherein the host comprises:
a host controller configured to communicate with one or more device drivers;
a communication interface configured to communicate with the host controller and with the plurality of devices; and
a link manager configured to control a first link between the host and a first device of the plurality of devices, the first device being point-to-point connected to the host,
wherein the host controller is configured to:
receive a link control message from a device driver,
determine whether the link control message is for controlling the first link or for controlling a subsequent link between two consecutive devices of the plurality of devices point-to-point connected to each other,
send a link control command to the link manager if the link control message is for controlling the first link, the link control command being equivalent to the link control message for controlling the first link, and
send a data/management (D/M) command to the first device through the communication interface if the link control message is for controlling the subsequent link, the D/M command being equivalent to the link control message for controlling the subsequent link.

2. The apparatus of claim 1, wherein the device driver does not send D/M messages to control the subsequent link.

3. The apparatus of claim 1,
wherein the link control message from the device driver includes a device identification (id), and
wherein the host controller is configured to:
determine that the link control message is for controlling the first link if the device id corresponds to the host, and
determine that the link control message is for controlling the subsequent link if the device id does not correspond to the host.

4. The apparatus of claim 1, wherein in response to the link control command from the host controller, the link manager is configured to control the first link by configuring the communication interface.

5. The apparatus of claim 4,
wherein in response to the link control command received from the host controller, the link manager is configured to report a link command status back to the host controller, the link command status corresponding to the link control command and indicating a result of an operation performed by the link manager in accordance with the link control command, and
wherein the host controller is configured to send a link message status to the device driver, the link message status being equivalent to the link command status.

6. The apparatus of claim 1, wherein if the link control message is for controlling the subsequent link, the host controller is configured to bypass the link manager for sending the D/M command to the first device.

7. The apparatus of claim 1, wherein if the link control message is for controlling the subsequent link,
the communication interface is configured to:
receive a D/M command status from the first device over the first link, the D/M command status corresponding to the D/M command and indicating a result of an operation or operations performed by one or more of the plurality of devices in accordance with the D/M command, and
report the D/M command status back to the host controller, and
the host controller is configured to send a link message status to the device driver, the link message status being equivalent to the D/M command status.

8. The apparatus of claim 7, wherein if the link control message is for controlling the subsequent link, the communication interface is configured to bypass the link manager for reporting the D/M command status back to the host controller.

9. The apparatus of claim 1,
wherein the communication interface comprises a link interface and a PHY interface,
wherein the link interface is configured to communicate with the PHY interface, the host controller, and the link manager, and is configured to provide a transport layer, a network layer, a data link layer, and a PHY adapter layer functionalities, and
wherein the PHY interface is configured to communicate with the link interface, the link manager and the first device over the first link, and is configured to provide a physical layer functionalities.

10. The apparatus of claim 9,
wherein the link interface is a Unipro interface configured to operate in compliance with a universal flash storage (UFS) standard, and
wherein the PHY interface is an M-PHY interface configured to operate in compliance with the UFS standard.

11. The apparatus of claim 1, wherein the link manager is a device management entity (DME) configured to operate in compliance with a universal flash storage (UFS) standard.

12. The apparatus of claim 1, wherein at least one device of the plurality of devices is a storage device configured to operate in compliance with a universal flash storage (UFS) standard.

13. The apparatus of claim 1, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

14. An apparatus, comprising:
a host; and
a plurality of devices daisy-chained to the host, the plurality of devices comprising a first device point-to-point connected to the host over a first link, and wherein the host comprises:
a host controller configured to communicate with one or more device drivers;
a communication interface configured to communicate with the host controller and with the plurality of devices; and
a link manager configured to control the first link,
wherein the host controller is configured to:
receive a link control message from a device driver,
determine whether the link control message is for controlling the first link or for controlling a subsequent link between two consecutive devices of the plurality of devices point-to-point connected to each other,
send a link control command to the link manager if the link control message is for controlling the first link, the link control command being equivalent to the link control message for controlling the first link, and
send a data/management (D/M) command to the first device through the communication interface if the link control message is for controlling the subsequent link, the D/M command being equivalent to the link control message for controlling the subsequent link.

15. The apparatus of claim 14,
wherein the link control message from the device driver includes a device identification (id), and
wherein the host controller is configured to:
determine that the link control message is for controlling the first link if the device id corresponds to the host, and
determine that the link control message is for controlling the subsequent link if the device id corresponds to a device of the plurality of devices.

16. The apparatus of claim 14, wherein if the link control message is for controlling the subsequent link, the host controller is configured to bypass the link manager for sending the D/M command to the first device.

17. The apparatus of claim 14,
wherein the plurality of devices include an intermediate device between the host and a last device,
wherein the intermediate device comprises a device controller, an upstream communication interface, a downlink manager, and a downlink communication interface,
wherein the upstream communication interface is configured to communicate with a previous device immediately upstream of the intermediate device over a previous link,
wherein the downlink communication interface is configured to communicate with a next device immediately downlink of the intermediate device over a next link,
wherein the device controller is configured to:
receive a D/M command from the previous device through the upstream communication interface,
determine whether the D/M command is for controlling the next link,
send a link control command to the downlink manager if the D/M command is for controlling the next link, the link control command being equivalent to the D/M command for controlling the next link, and
forward the D/M command to the next device through the downlink communication interface if the D/M command is not for controlling the next link.

18. The apparatus of claim 17,
wherein in response to the link control command from the device controller, the downlink manager is configured to:
control the next link by configuring the downlink communication interface, and
report a link command status back to the device controller, the link command status corresponding to the link control command and indicating a result of an operation performed by the downlink manager in accordance with the link control command, and
wherein if the D/M command is for controlling the next link, the device controller is configured to send a D/M command status equivalent to the link command status to the previous device through the upstream communication interface, and
wherein if the D/M command is not for controlling the next link, the device controller is configured to:
receive the D/M command status from the next device through the downlink communication interface, and
send the received D/M command status equivalent to the link command status to the previous device through the upstream communication interface.

19. The apparatus of claim 17,
wherein the upstream communication interface comprises an upstream link interface and an upstream PHY interface,
wherein the downlink communication interface comprises a downstream link interface and a downstream PHY interface,
wherein the upstream and downstream link interfaces are Unipro interfaces configured to operate in compliance with a universal flash storage (UFS) standard, and
wherein the upstream PHY and downstream PHY interfaces are M-PHY interfaces configured to operate in compliance with the UFS standard.

20. The apparatus of claim 14, wherein at least one device of the plurality of devices is a storage device configured to operate in compliance with a universal flash storage (UFS) standard.

21. The apparatus of claim 14, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

22. A method of an apparatus comprising a host and a plurality of devices daisy-chained to the host, the method comprising:
receiving, by a host controller of the host, a link control message from a device driver;
determining, by the host controller, whether the link control message is for controlling a first link or for controlling a subsequent link, wherein the first link is a link between the host and a first device of the plurality of devices point-to-point connected to the host, and wherein the subsequent link is a link between any two consecutive devices of the plurality of devices point-to-point connected to each other;
sending, by the host controller, a link control command to a link manager of the host if the link control command is for controlling the first link, wherein link control command is equivalent to the link control message for controlling the first link; and sending, by the host controller, a data/management (D/M) command to the first device through a communication interface of the host if the link control command is for controlling the subsequent link, wherein the D/M command is equivalent to the link control message for controlling the subsequent link and the communication interface interfaces with the first device over the first link, wherein the link manager is bypassed for sending the D/M command to the first device.

23. The method of claim 22, wherein determining whether the link control message is for controlling the first link or for controlling the subsequent link comprises:

determining whether or not a device identification (id) included in the link control message corresponds to the host;

determining that the link control message is for controlling the first link if the device id does correspond to the host; and determining that the link control message is for controlling the subsequent link if the device id does not correspond to the host.

24. The method of claim 22, further comprising:

configuring, by the link manager, the communication interface in response to the link control command from the host controller;

reporting, by the link manager, a link command status back to the host controller, wherein the link command status corresponds to the link control command and indicates a result of an operation performed by the link manager in accordance with the link control command; and sending, by the host controller, a link message status to the device driver in response to the link command status from the link manager, wherein the link message status is equivalent to the link command status.

25. The method of claim 22, further comprising:

receiving, by the communication interface, a D/M command status from the first device over the first link, wherein the D/M command status corresponds to the D/M command and indicates a result of an operation or operations performed by one or more of the plurality of devices in accordance with the D/M command;

reporting, by the communication interface, the D/M command status back to the host controller; and sending, by the host controller, a link message status to the device driver in response to the D/M command status from the communication interface, wherein the link message status is equivalent to the D/M command status, wherein the link manager is bypassed for reporting the D/M command status back to the host controller if the link control command is for controlling the subsequent link.

26. An apparatus, comprising:

a host configured to communicate with a plurality of devices daisy-chained to the host, wherein the host comprises:

a host controller configured to communicate with one or more device drivers;

a communication interface configured to communicate with the host controller and with the plurality of devices; and a link manager configured to control a first link between the host and a first device of the plurality of devices, the first device being point-to-point connected to the host, wherein the host controller is comprises:

means for receiving a link control message from a device driver, means for determining whether the link control message is for controlling the first link or for controlling a subsequent link between two consecutive devices of the plurality of devices point-to-point connected to each other, means for sending a link control command to the link manager if the link control message is for controlling the first link, the link control command being equivalent to the link control message for controlling the first link, and means for sending a data/management (D/M) command to the first device through the communication interface if the link control message is for controlling the subsequent link, the D/M command being equivalent to the link control message for controlling the subsequent link.

27. The apparatus of claim 26, wherein the link control message from the device driver includes a device identification (id), and wherein the means for determining determines that the link control message is for controlling the first link if the device id corresponds to the host, and determines that the link control message is for controlling the subsequent link if the device id does not correspond to the host.

28. The apparatus of claim 26, wherein the link manager comprises:

means for configuring the communication interface to control the first link in response to the link control command from the host controller; and means for reporting a link command status back to the host controller, the link command status corresponding to the link control command and indicating a result of an operation performed by the link manager in accordance with the link control command, and wherein host controller further comprises means for sending a link message status to the device driver, the link message status being equivalent to the link command status.

29. The apparatus of claim 26, wherein if the link control message is for controlling the subsequent link, the means for sending the D/M command to the first device bypasses the link manager.

30. The apparatus of claim 26, wherein if the link control message is for controlling the subsequent link, the communication interface comprises:

means for receiving a D/M command status from the first device over the first link, the D/M command status corresponding to the D/M command and indicating a result of an operation or operations performed by one or more of the plurality of devices in accordance with the D/M command; and means for reporting the D/M command status back to the host controller, and the host controller further comprises means for sending a link message status to the device driver, the link message status being equivalent to the D/M command status.

31. The apparatus of claim 30, wherein if the link control message is for controlling the subsequent link, the means for reporting the D/M command status bypasses the link manager.

32. The apparatus of claim 26, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

\* \* \* \* \*